United States Patent
Maltseff et al.

(10) Patent No.: US 7,395,474 B2
(45) Date of Patent: Jul. 1, 2008

(54) LAB-ON-CHIP SYSTEM AND METHOD AND APPARATUS FOR MANUFACTURING AND OPERATING SAME

(75) Inventors: Paul A. Maltseff, Edmonds, WA (US); Ronald D. Payne, Snohomish, WA (US)

(73) Assignee: Intermec IP Corp., Everett, WA (US)

( * ) Notice: Subject to any disclaimer, the term of this patent is extended or adjusted under 35 U.S.C. 154(b) by 444 days.

(21) Appl. No.: 10/909,920

(22) Filed: Aug. 2, 2004

(65) Prior Publication Data

US 2005/0066246 A1    Mar. 24, 2005

Related U.S. Application Data

(60) Provisional application No. 60/492,125, filed on Aug. 1, 2003.

(51) Int. Cl.
*G01R 31/28* (2006.01)
(52) U.S. Cl. .......................... 714/733; 714/30
(58) Field of Classification Search .................. 703/20; 607/2; 320/101; 257/678; 340/10.41; 417/53; 714/733, 30; 343/895; 356/503; 210/321.84
See application file for complete search history.

(56) References Cited

U.S. PATENT DOCUMENTS

| | | | |
|---|---|---|---|
| 4,979,506 A | 12/1990 | Silvian | |
| 5,808,587 A | 9/1998 | Shima | 343/895 |
| 5,973,598 A | 10/1999 | Beigel | 340/572.1 |
| 6,294,997 B1 | 9/2001 | Paratore et al. | 340/572.1 |
| 6,429,775 B1 | 8/2002 | Martinez et al. | 340/572.1 |
| 6,499,006 B1 * | 12/2002 | Rappaport et al. | 703/20 |
| 6,667,725 B1 * | 12/2003 | Simons et al. | 343/895 |
| 6,728,916 B2 | 4/2004 | Chen et al. | |
| 6,747,556 B2 | 6/2004 | Medema et al. | |
| 6,804,552 B2 * | 10/2004 | Thompson et al. | 607/2 |
| 6,882,128 B1 * | 4/2005 | Rahmel et al. | 320/101 |
| 6,917,099 B2 * | 7/2005 | Hellekson et al. | 257/678 |
| 6,937,150 B2 | 8/2005 | Medema et al. | |
| 6,950,193 B1 * | 9/2005 | Discenzo | 356/503 |
| 7,034,660 B2 * | 4/2006 | Watters et al. | 340/10.41 |
| 7,090,471 B2 * | 8/2006 | Xie et al. | 417/53 |
| 7,096,068 B2 | 8/2006 | Mass et al. | |
| 7,201,846 B2 * | 4/2007 | Cho et al. | 210/321.84 |

OTHER PUBLICATIONS

U.S. Appl. No. 10/909,919, filed Aug. 2, 2004, Maltseff et al.
U.S. Appl. No. 60/492,123, filed Aug. 1, 2003, Maltseff et al.
U.S. Appl. No. 60/492,125, filed Aug. 1, 2003, Maltseff et al.
MEMS and Nanotechnology Clearinghouse, "What is MEMS Technology?," retrieved Jul. 19, 2004, from http://www.memsnet.org/mems/what-is.html.

(Continued)

*Primary Examiner*—David Ton
(74) *Attorney, Agent, or Firm*—Seed IP Law Group PLLC

(57) ABSTRACT

A lab-on-chip system comprises an antenna and a communications subsystem to wirelessly transmit information from the lab-on-chip system. The communications subsystem may also receive information, data or instructions from an off-chip system or device. The lab-on-chip system may comprise a passive power subsystem coupled to an antenna to wirelessly receive power in the form of an electromagnetic field, which provides electrical power derived therefrom to at least one other subsystem of the lab-on-chip system.

44 Claims, 14 Drawing Sheets

OTHER PUBLICATIONS

"Microfabrication Glossary," retrieved Jul. 19, 2004, from http://www.memsnet.org/glossary/.

Mohseni, K., "MicroPumps—MicroFluidics ASEN 5519," Department of Aerospace Engineering Sciences, University of Colorado at Boulder, Spring 2004.

Mutlu, S., "Microfluidic Biochemical Analysis System with Electro-Osmotic Pump and Thermally Responsive Polymer Valve," Faculty Candidate Seminar Announcement, retrieved Jul. 16, 2004, from http://www.azbio.org/news/FacultySeminar.html.

Mutlu, S., et al., "Micromachined Porous Polymer for Bubble Free Electro-Osmotic Pump," in *Proceedings of the IEEE MEMS Conference*, Las Vegas, Jan. 20-24, 2002, pp. 19-24.

Su, Y-C., et al., "A Water-Powered Osmotic Microactuator," *Journal of Microelectromechanical Systems* 11(6):736-742, Dec. 2002.

Utah State Center of Excellence for Biomedical Microfluidics, "Micro-FFF," May 11, 2004, retrieved Jul. 16, 2004, from http://www.mems.utah.edu/Project%20Pages/FFF.htm.

Utah State Center of Excellence for Biomedical Microfluidics, "Detectors," May 11, 2004, retrieved Jul. 16, 2004, from http://www.mems.utah.edu/Project%20Pages/Detector.htm.

Vennemann, P., "Micropumps—Concepts and Design Examples," TUDelft Laboratory for Aero- and Hydrodynamics, Feb. 26, 2004.

Charlot et al., "Electrically Induce Stimuli for MEMS Self-Test," VLSI Test Symposium, 19th IEEE Proceedings on VTS 2001, May 2001, pp. 210-215.

\* cited by examiner

LAB-ON-CHIP SYSTEM AND METHOD AND APPARATUS FOR MANUFACTURING AND OPERATING SAME

BACKGROUND OF THE INVENTION

1. Field of the Invention

This disclosure generally relates to lab-on-chip systems typically employing micro-electrical-mechanical structure (MEMS), and to the manufacturing and/or operation of lab-on-chip systems.

2. Description of the Related Art

Progress in nano-technology including manufacture of MEMS devices is making sophisticated lab-on-chip systems, also known as total analysis systems (μTAS), commercially viable. Lab-on-chip technology uses integrated circuit like micro-fabrication techniques to translate experimental and analytical protocols into chip architectures, typically formed as fluid reservoirs and interconnected pathways The lab-on-chip systems typically employ one or more MEMS devices, which may take a variety of forms. For example, MEMS devices may take the form of various microfluidic devices capable of performing operations on small bodies of fluids and/or on particles suspended in a fluid, for example, a colloidal suspension. Microfluidic devices commonly employ fluids such as whole blood samples, bacterial cell suspensions, protein or antibody solutions, and various buffers, and reagents.

Microfluidic devices may include one or more channels typically with a dimension less than one millimeter, or may take the form of a channeless field or array. Microfluidic devices may employ pumps, valves, gears, electrodes and other structures, which typically have analogs on the macroscopic world, to move fluids and/or suspended particles using, for example, pressure or electrokinetic forces. The controlled movement may be employed to combine materials, divide materials, concentrate materials, direct materials to reagents, etcetera.

Microfluidic devices may be used to obtain a variety of measurements including molecular diffusion coefficients, fluid viscosity, pH, chemical binding coefficients, and enzyme reaction kinetics. Other application for microfluidic devices include capillary electrophoreses, isoelectric focusing, electrowetting, immunoassays, flow cytometry, sample injection of proteins for analysis via mass spectrometry, PCR amplification, DNA analysis, cell manipulation, cell separation, cell patterning and/or chemical gradient formation. Many of these applications have utility for clinical diagnostics.

Lab-on-chip systems may have several advantages over conventional laboratory systems. For example, such systems typically have a smaller physical footprint than standard laboratory setups, and have low power consumption. Micro-fabrication techniques permit simplified manufacturing and superior reproducibility, reducing costs. Lab-on-chip systems also provide the ability to work with very small volumes of samples, agents, reagents or other materials. This lowers the cost of materials, permits smaller samples to be taken from test subjects, such as patients, and also reduces disposal costs. Lab-on-chip systems may enhance automation leading to lower costs, higher throughput and more consistent results.

There is still significant room for improvement in the structure of lab-on-chip systems, and in the manufacture and operation of such device. Such improvements may be directed at reducing the cost of such devices, and making the devices more reliable and easier to operate.

BRIEF SUMMARY OF THE INVENTION

In one aspect, a lab-on-chip system comprises at least a first micro-electrical-mechanical structure formed on at least a portion of the substrate, the first micro-electrical-mechanical structure operable to perform at least one physical action on at least one physical work product; an antenna carried by the substrate; and a passive power circuit carried by the substrate and coupled to the antenna to wirelessly receive power thereby in the form of an electromagnetic field and coupled to provide power to operate at least the first micro-electrical-mechanical structure.

In another aspect, a lab-on-chip system comprises a substrate; at least a first micro-electrical-mechanical structure formed on at least a portion of the substrate, the first micro-electrical-mechanical structure operable to perform at least one physical action on at least one physical work product; an antenna; and a communications circuit carried by the substrate, coupled to the antenna and operable to wirelessly transmit information from the lab-on-chip system. The antenna may be carried by the substrate or may be provided independently of the substrate. The lab-on-chip system may comprise a communications subsystem to transmit the information or data from the lab-on-chip system and/or receive information, data or instructions from an off-chip system or device. The lab-on-chip system may comprise a passive power subsystem coupled to an antenna to wirelessly receive power in the form of an electromagnetic field and coupled to provide electrical power derived therefrom to at least one other subsystem of the lab-on-chip system.

In a further aspect, a method of operating a lab-on-chip system comprises wirelessly receiving an electromagnetic field at an antenna; converting the wireless signal into electrical power; and driving at least one micro-electrical-mechanical structure with the electrical power.

In still a further aspect, a method of operating a lab-on-chip system comprises determining at least one of an operating characteristic of a first micro-electrical-mechanical structure or a physical characteristic of the physical work product; and wirelessly transmitting the determined information from the lab-on-chip system.

In even a further aspect, a method of operating a lab-on-chip system comprises determining at least one of an operating characteristic of a first micro-electrical-mechanical structure or a physical characteristic of the physical work product; and storing the determined information on the lab-on-chip system.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the relevant art will recognize that the invention may be practiced without one or more of these specific details, or with other methods, components, materials, etc. In other instances, well-known structures associated with lab-on-chip systems, micro-electrical-mechanical structure (MEMS) such as microfluidic devices, controllers, communications circuits, transmitters, receivers, transceivers and passive power supplies, and methods of manufacturing and operating same have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Figure 1:
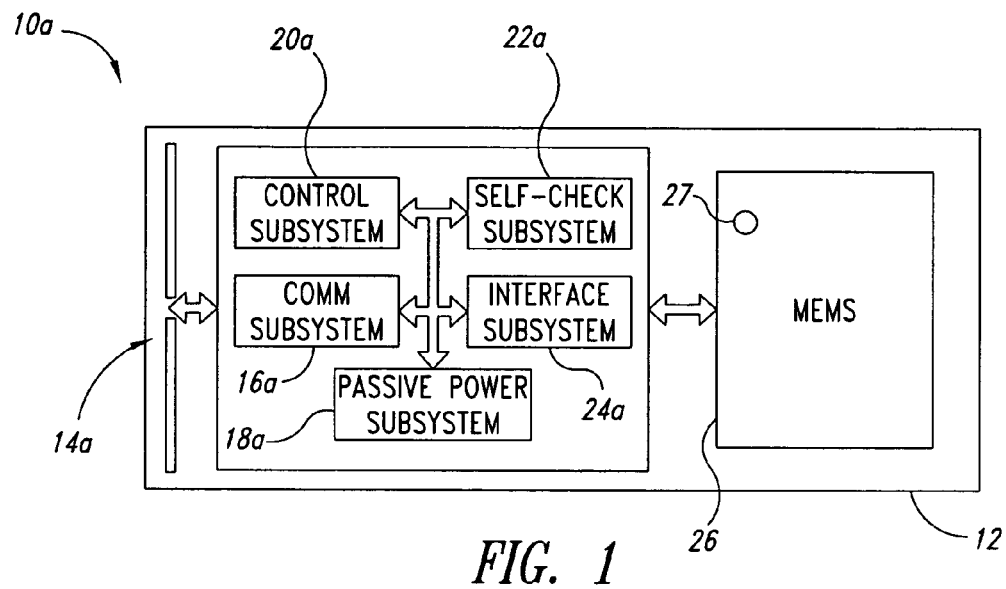
FIG. 1 is a functional block diagram of a lab-on-chip system according to one illustrated embodiment.

FIG. 1 shows a lab-on-chip system 10a according to one illustrated embodiment where one or more subsystems are integrally formed on a substrate 12. The substrate may comprise one or more layers of various materials for example: insulators or dielectrics such as glass, ceramic and/or poly-crystalline silicon; conductors such as copper, gold, silver, and/or aluminum; and/or semiconductors such as doped silicon, germanium, gallium arsenide and/or gallium arsenide phosphide.

The lab-on-chip system 10a includes a variety of subsystems to handle various aspects of operation. The lab-on-chip system 10a may include one or more antennas 14a and communications subsystems 16a coupled to the antenna 14a to provide wireless communications from and/or to the lab-on-chip system 10a. The antenna 144a may be formed as one or more conductive traces formed on the substrate 12. The conductive traces may be formed, for example, by depositing and/or etching using standard printed circuit board and/or micro-fabrication techniques (e.g., techniques employed in fabrication of integrated circuits or micro-electrical-mechanical structure (MEMS)). While illustrated as a dipole antenna 14a, the antenna may take a variety of forms, for example a coil antenna or Yagi antenna, depending on the particular environment and application in which the lab-on-chip will be used.

Figure 2:
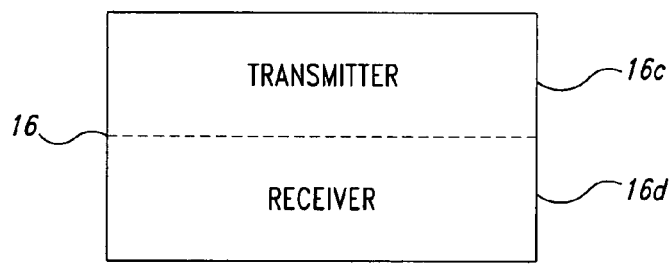
FIG. 2 is a functional block diagram of a communications subsystem according to one illustrated embodiment, for use with the lab-on-chip system of FIGS. 1 and 3.

The communications subsystem 16a may likewise be integrally formed on the substrate 12 using standard printed circuit board and/or micro-fabrication techniques. In the embodiment illustrated in FIG. 1, the communications subsystem is formed as a communications circuit such as those commonly associated with passive radio frequency identification (RFID) tags or passive store security tags. In another embodiment illustrated in FIG. 2, the communications subsystem may comprises a transmitter 16c and/or receiver 16d. The transmitter 16c and receiver 16d may be formed individually, or may be formed as a transceiver 16.

The chip-on-lab system 10a may also include a passive power subsystem 18a which may be integrally formed on the substrate 12 using standard printed circuit board and/or micro-fabrication techniques. The passive power subsystem 18a is so denominated because it derives electrical power from electromagnetic fields, for example RF signals, wirelessly received at the antenna 14a and provides the electrical power to operate one or more of the other subsystems. The passive power subsystem 18a may include a voltage rectifier and/or energy storage device such as a capacitor or ultra capacitor. The passive power subsystem 18a may employ various circuitry and/or techniques from the field of radio-frequency identification (RFID) such as those taught in U.S. Pat. No. 6,429,775; U.S. Pat. No. 5,808,587; and/or U.S. Pat. No. 5,973,598 for deriving power from the wireless signals.

The lab-on-chip system 10a may further include a control subsystem 20a which may be integrally formed on the substrate 12 using standard printed circuit board and/or micro-fabrication techniques. The control subsystem 20a controls operation of one or more of the other subsystems. The control subsystem 20a may be hardwired, in a form similar to an application specific integrated circuit (ASIC). Alternatively, the control subsystem 20a may execute instructions provided in a program or other software routine, in a form similar to a microcontroller or microprocessor. The instructions may be stored in a memory such as a register, read-only memory (ROM) and/or a random access memory (RAM) which may be formed as part of the control subsystem 20a, or may be distinct therefrom. The memory of the control subsystem 20a may be preconfigured or programmed with instructions and/ or may receive instructions via the antenna 14a and communications subsystem 16a.

The lab-on-chip system 10a may further include a self check subsystem 22a which may be integrally formed in the substrate 12 using common printed circuit board and/or micro-fabrication techniques. The self check subsystem 22a executes self check tests of one or more subsystems, and may even perform a self check test on the self check subsystem 22a itself. The self check subsystem 22a may provide results of one or more self check tests from the lab-on-chip system 10a via the communications subsystem 16a and antenna 14a. The self check subsystem may be hardwired in a fashion similar to an ASIC, or may execute instructions stored in a memory such as a register, ROM or RAM which may form a portion of the self check subsystem 22a or may be distinct therefrom.

The lab-on-chip system 10a may further include an interface subsystem 24a to interface which may be integrally formed in the substrate 12 using common printed circuit board and/or micro-fabrication techniques. The interface subsystem 24a interfaces with one or more MEMS devices 26, for example, pumps, valves, electrodes, channels, sensors 27 and/or other transducers. Some specific examples of MEMS devices are discussed below with reference to FIGS. 5-9.

Figure 3:
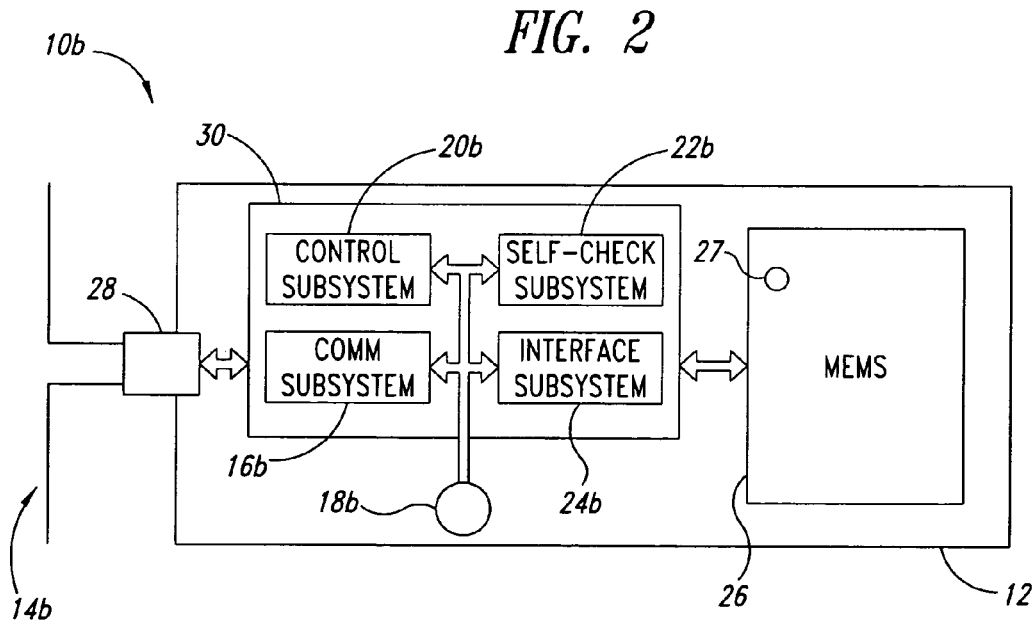
FIG. 3 is a functional block diagram of a lab-on-chip system according to another illustrated embodiment.
Figure 4:
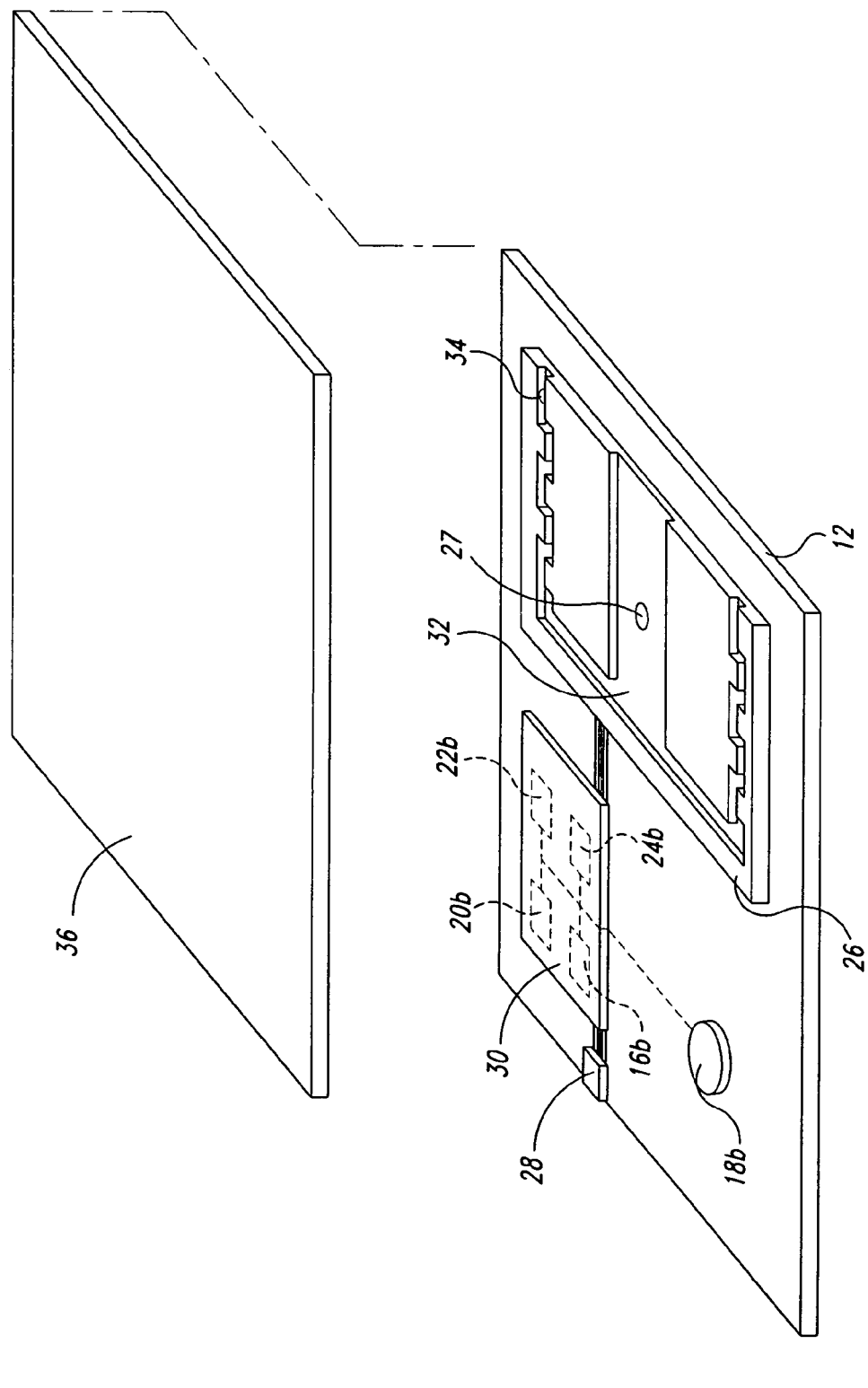
FIG. 4 is a top isometric partially exploded view of a lab-on-chip system of FIG. 3.

FIGS. 3 and 4 show a lab-on-chip system 10b according to another illustrated embodiment in which one or more subsystems are discretely formed as one or more separate wafers or chips 30, which are placed, soldered or otherwise located on the substrate 12. The wafer(s) or chip(s) 30 may be packaged or unpackaged, and may be mounted to the substrate 12 using any of a variety of mounting techniques, for example, via flip chip techniques.

The wafer or chip 30 may be physically and/or logically partitioned into separate subsystems such as a communications subsystem 16b, control subsystem 20b, self check subsystem 22b and interface subsystem 24b. The lab-on-chip system 10b may include a communications port 28 to physically and communicatingly couple an off-substrate antenna 14b to the communications subsystem 16b carried by the substrate 12.

The lab-on-chip system 10b may employ a discrete power source 18b such as one or more battery cells and/or ultra capacitors. The discrete power source 18b may take the place of the passive power subsystem 18a (FIG. 1) or may be provided in addition to the passive power subsystem 18a.

As best illustrated in FIG. 4, the substrate 12 may carry one or more MEMS devices. The MEMS devices may, for example, include one or more channels 32 formed in one or more layers of the substrate 12. The channels 32 may be formed to contain and/or direct movement of one or more fluid bodies 34 as is commonly understood in the field of MEMS technology and particularly in the field of microfluidic technology. The lab-on-chip system 10b may include a cover 36 to at least partially enclose the channel 32 and/or protect elements of the various subsystems or buses interconnecting the various subsystems. The cover 36 may take the form of glass or another insulative material, and may or may not be transparent.

The MEMS devices may include one or more sensors 27 operable to sense or detect one or more operating characteristics of one or more MEMS devices and/or one or more physical characteristics of the work product. The sensors may take a variety of forms. For example, rotational encoders and/or optical sensors may be employed to detect the movement and/or position of work products such as fluid bodies, agents, reagents, and/or samples. Rotational encoders and/or optical sensors may additionally or alternatively be employed to detect the movement and/or position of various components of the MEMS devices such as gears, valves and/or actuators. Likewise, inductive sensors similar to those employed in touch screen devices may be employed to detect movement, position, and/or pressure of one of the work products or MEMS devices. Further, chemical sensors may be employed to, for example, detect the occurrence or results of a chemical or biological reaction. Accelerometers may be employed to detect the rate of change or force of a work product or MEMS device. Voltage sensors, current sensors, resistivity sensors may be employed to detect various electrical characteristics of one or more work products and/or one or more MEMS devices. As will be readily apparent to those of ordinary skill in the art, the types of sensors should not be limited to those disclosed herein.

Figure 5:
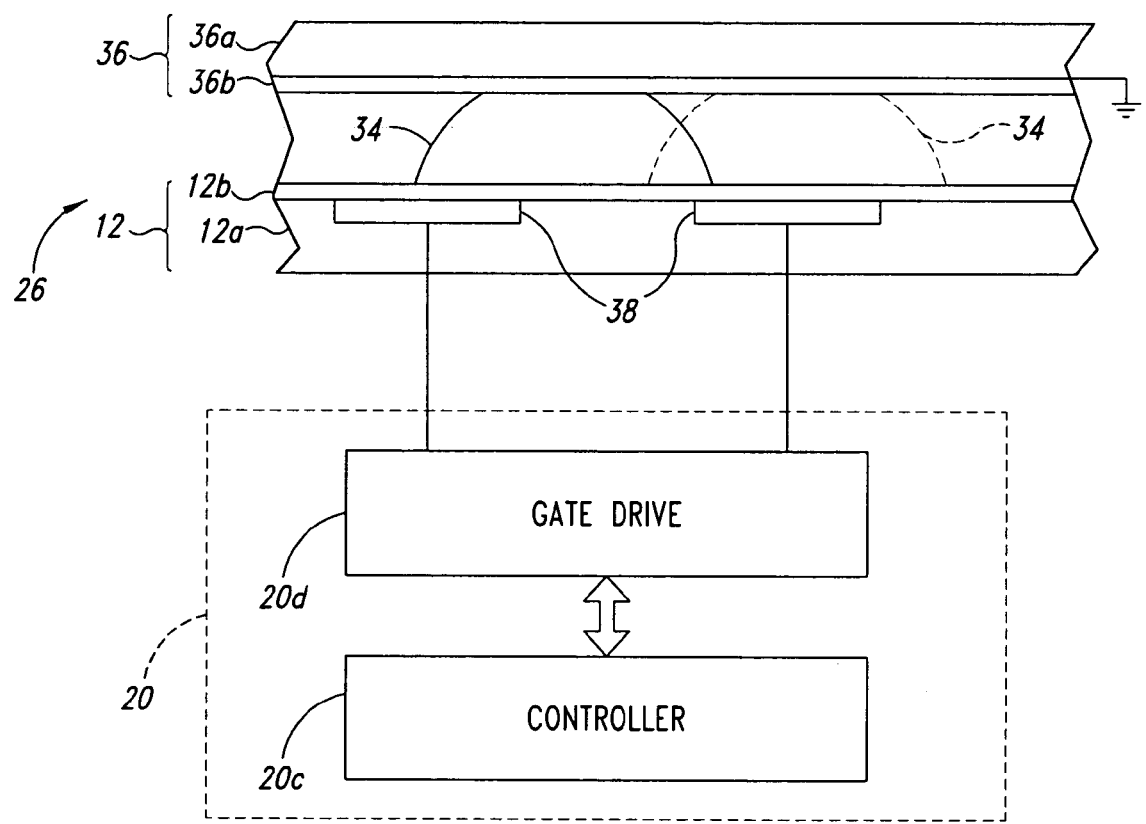
FIG. 5 is partially a cross-sectional view of a MEMS device in the form of an array of electrodes suitable for use in electro-wetting, and partially a functional block diagram of a control subsystem coupled to control operation of the MEMS device according to one illustrated embodiment.

FIG. 5 shows an embodiment of a MEMS device 26 particularly useful in microfluidics operations such as electrowetting. The MEMS device 26 comprises a plurality of electrodes 38 spaced about a portion of the substrate 12 and selectively actuable to apply a potential to a portion of the fluid body 34. The substrate 12 may comprise one or more layers, for example a base 12a and a fluid compatibility coating or layer 12b. The fluid compatibility layer 12b may comprise a hydrophobic material to achieve the desired interaction between the fluid body 34, and the substrate 12, for example, to achieve a desired contact angle between the fluid body 34 and the substrate 12. The hydrophobic material may be a dielectric, and may overlay the electrodes 38 to electrically insulate the same. In some embodiments, the fluid compatibility layer 12b may alternatively comprise a hydrophilic material, which may or may not constitute a dielectric.

The cover 36 may comprise one or more layers, for example glass 36a and a conductive layer 362b such as transparent Indium Tin Oxide ("ITO") which may serve as a ground electrode to provide a ground potential to the fluid body 34. The control subsystem 20 may include a controller 20c to control the operation of the electrodes 38 and gate drive circuitry 20d to transform the instructions from the controller 20c to control signals for driving individual ones of the electrodes 38. By sequentially activating electrodes 38, the fluid body 34 can be moved from a first position (shown in solid line) to a second position (shown in broken line).

Figure 6:
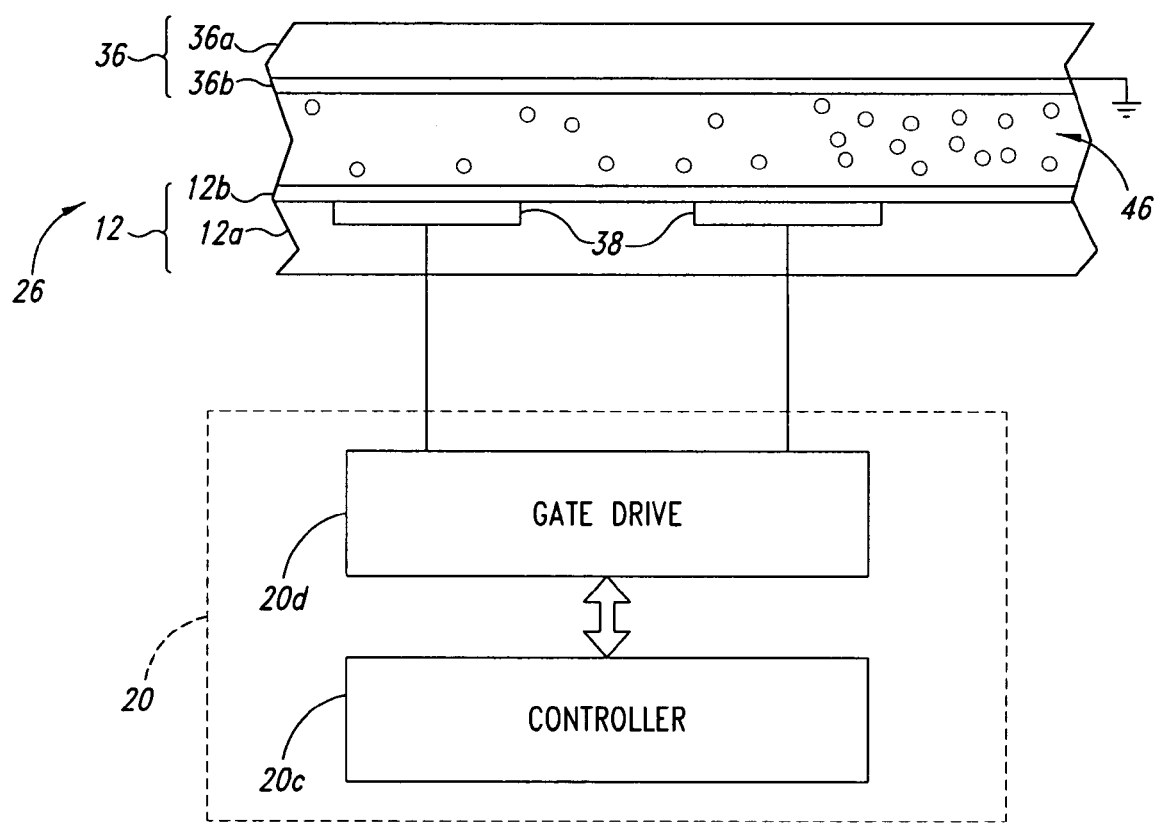
FIG. 6 is partially a cross-sectional view of a MEMS device in the form of an array of electrodes suitable for use in elec-trophoreses and partially a functional block diagram of a control system coupled to the control the array of electrodes according to another illustrated embodiment.

FIG. 6 shows another MEMS device 26 particularly useful in microfluidics operations such as electrophoreses. Many of the elements of FIG. 6 are similar or analogous to the elements of FIG. 5 so will not be discussed in detail. The fluid body 34 includes one or more particles 46 suspended in the fluid body 34, such as in a colloidal suspension. Activation of the electrodes 38 may cause the particles 46 to migrate through the fluid body 34, as is commonly known in electrophoreses.

Figure 7:
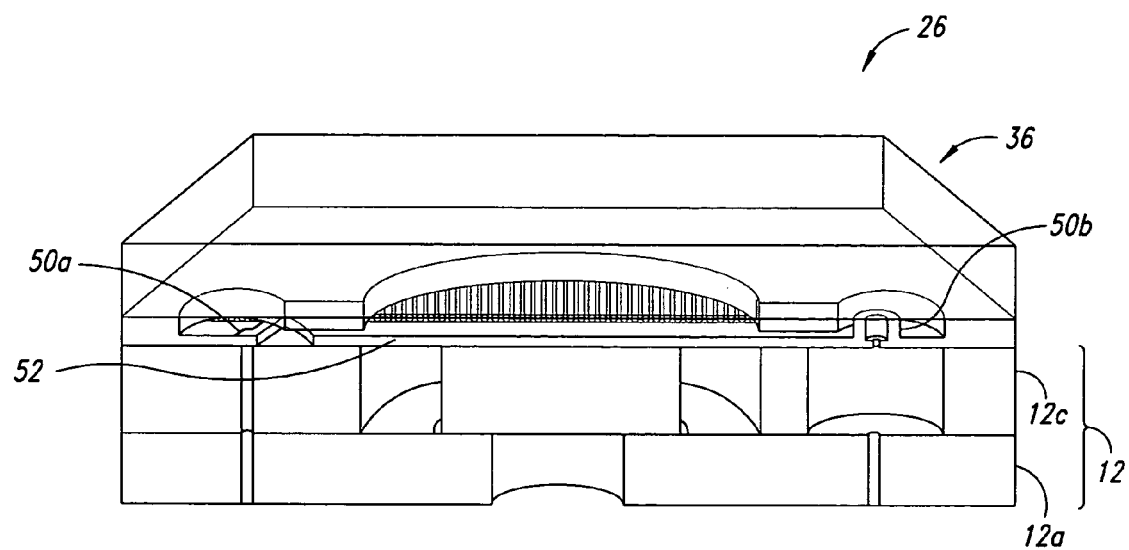
FIG. 7 is a cross-sectional view of a MEMS device in the form of a check valve according to one illustrated embodiment.

FIG. 7 shows a further embodiment of the MEMS device 26 in the form of a silicon check valve pump. A lower portions 12a of the substrate 12 may support a patterned layer 12c to form an inlet valve 50a and an outlet valve 50b which cooperates with a silicon member 52 to form the silicon check valve pump.

Figure 8:
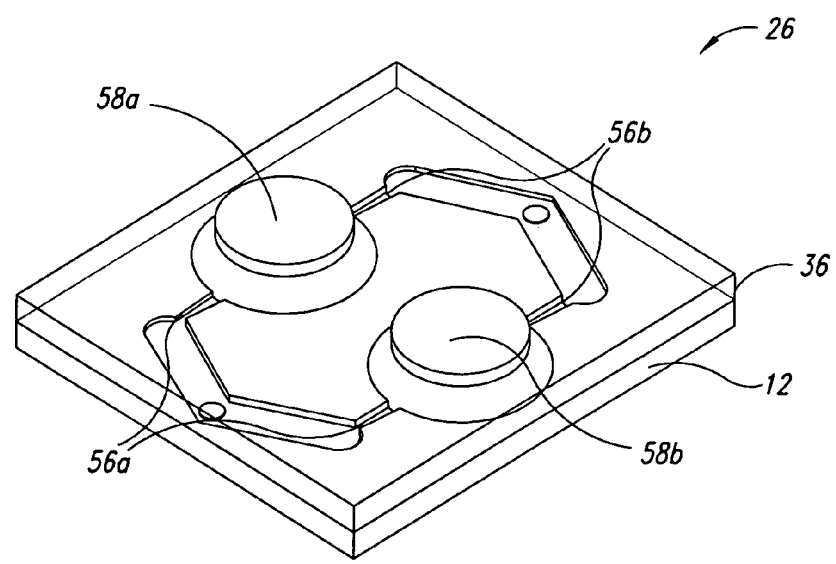
FIG. 8 is an isometric view of a MEMS device in the form of a fixed geometry valve pump according to another illustrated embodiment.

FIG. 8 shows still a further embodiment of a MEMS device 26 in the form of fixed geometry valve pump. The substrate 12 is patterned to form a number of channels defining inlet diffuser elements 56a and outlet diffuser elements 56b. A pair of piezoelectric drive disks 58 are operable to pump fluid from the inlet diffuser elements to the outlet diffuser elements 56b.

Figure 9:
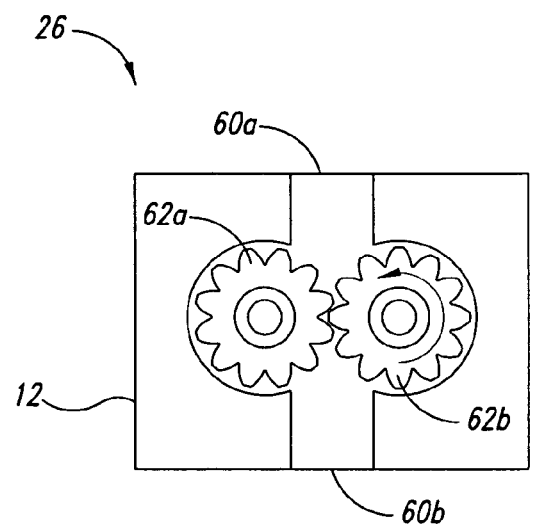
FIG. 9 is a top plan view of a MEMS device in the form of a microgear pump according to a further illustrated embodiment.

FIG. 9 shows yet a further MEMS device 26 in the form of a micro-gear pump. The substrate 12 is patterned to form an inlet 60a and an outlet 60b with a channel extending therebetween. The pair of intermeshing gears 62a, 62b are electromagnetically operable to move fluid from the inlet 60a to the outlet 60b.

Figure 10:
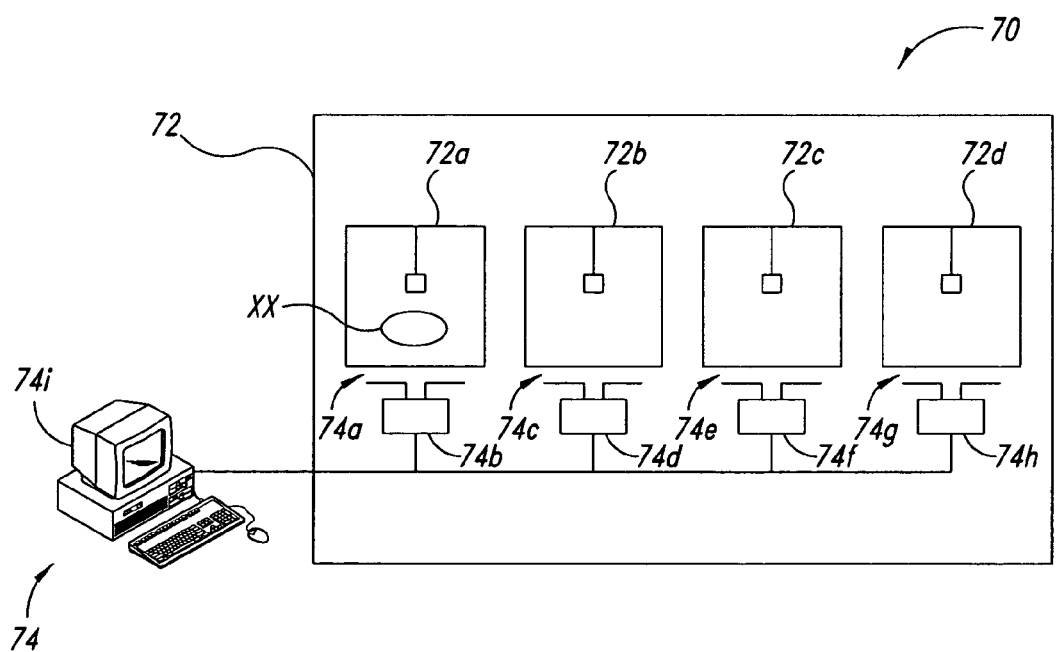
FIG. 10 is a schematic diagram of a manufacturing environment to manufacture the lab-on-chip systems according to one illustrated embodiment.

FIG. 10 shows a manufacturing environment 70 suitable for manufacturing lab-on-chip systems 10a, 10b (collectively 10) according to one illustrated embodiment.

The manufacturing environment 70 may include one or more clean rooms 72 housing manufacturing equipment such as equipment typically associated with the micro-fabrication industry. One or more depositioning devices 72a may be employed for depositioning various layers on the substrate 12. One or more masking devices 72b may be employed for masking various layers of the substrate 12. One or more etching devices 72c may be employed for etching the various layers of the substrate 12. One or more cutting devices (not shown) may be employed for cutting the substrate 12 or a wafer in which the substrate resides. One or more pick and place devices 72d may be employed to automatically pick packaged or unpackaged chips and place the chips on the substrate 12. While only a single instance of each type of manufacturing device 72a-72d is illustrated, many manufacturing environments may contain multiple instances of any of the manufacturing devices 72a-72d. During fabrication, a substrate may return to the same manufacturing device 72a-72d multiple times.

A manufacturing control system 74 may control operation of one or more of the manufacturing devices 72a-72d. In particular the manufacturing control system 74 may include one or more antennas, transmitters, receivers, or transceivers, commonly referred to as interrogators, positioned throughout the clean room 72. For example, a first antenna 74a and/or transceiver 74b may be positioned proximate or otherwise associated with the depositioning device 72a. A second antenna 74c and/or transceiver 74d may be positioned proximate or otherwise associated with the masking device 72b. A third antenna 74e and/or transceiver 74f may be positioned proximate or otherwise associated with the etching device 72c. A fourth antenna 74g and/or transceiver 74h may be positioned proximate or otherwise associated with the pick and place machinery 72d.

The manufacturing control system 74 may also include one or more manufacturing computing systems 74i. The transceivers 74b, 74d, 74f, 74h may provide signals or information received from the lab-on-chip systems 10 to the computing system 74i. The transceivers 74b, 74d, 74f, 74h may additionally, or alternatively provide signals or information received from the manufacturing computing system 74i to the lab-on-chip systems 10. The manufacturing computing system 74i may be programmed to control manufacturing operation based on the information received from the individual lab-on-chip systems 10, for example, the results of self check tests performed on the various lab-on-chip systems 10.

While FIG. 10 illustrates a one-to-one pairing between the manufacturing devices 72a-72d and antenna and transceiver combinations, other topologies are of course possible. The particular typology will depend on the particular layout of the manufacturing environment 70 as well as the signal strength of antennas and transceivers of both the manufacturing control system 74 and the lab-on-chip systems 10.

Figure 11:
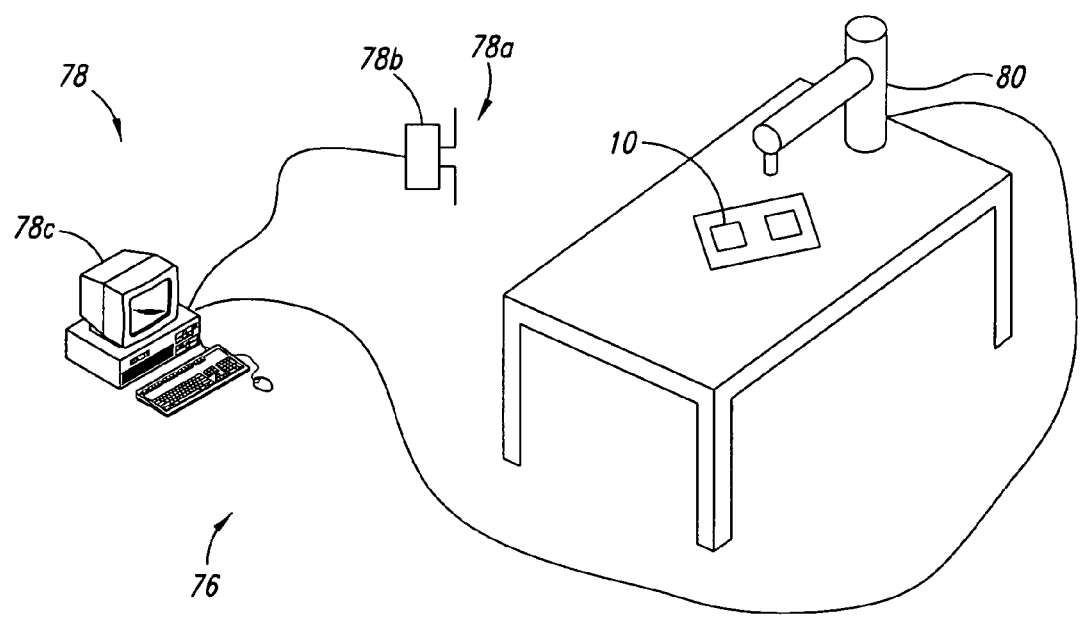
FIG. 11 is a schematic diagram of a laboratory or other facility in which lab-on-chip systems are used according to another illustrated embodiment.

FIG. 11 shows a laboratory or other environment 76 suitable for using the lab-on-chip systems 10. The laboratory environment 76 may include a laboratory system 78 to analyze information resulting from operation of the lab-on-chip system 10. The laboratory system 78 may include one or more antennas 78a positioned to communicate with the lab-on-chip system 10, one or more transmitters, receivers, or transceivers commonly known as interrogators 78b communicatingly coupled to the antenna 78a, and one or more laboratory computing systems 78c coupled to receive and process information received from the lab-on-chip system 10 via the antenna 78 and transceiver 78b. The laboratory computing system 78c may include one or more programs for analyzing data collected by the lab-on-chip system 10. The laboratory environment 76 may also include one or more automated laboratory devices 80 operable to physically interact with the lab-on-chip system 10. For example, the laboratory device 80 may provide agents, reagents, samples or other materials to the lab-on-chip system 10, for example, via a pipette array dispenser. The laboratory device 80 may be under control of the laboratory computing system 78c, or may be operated independently thereof. The laboratory device 80 may further include sensors such as optical devices to sense various physical characteristics of the lab-on-chip system 10.

Figure 12A:
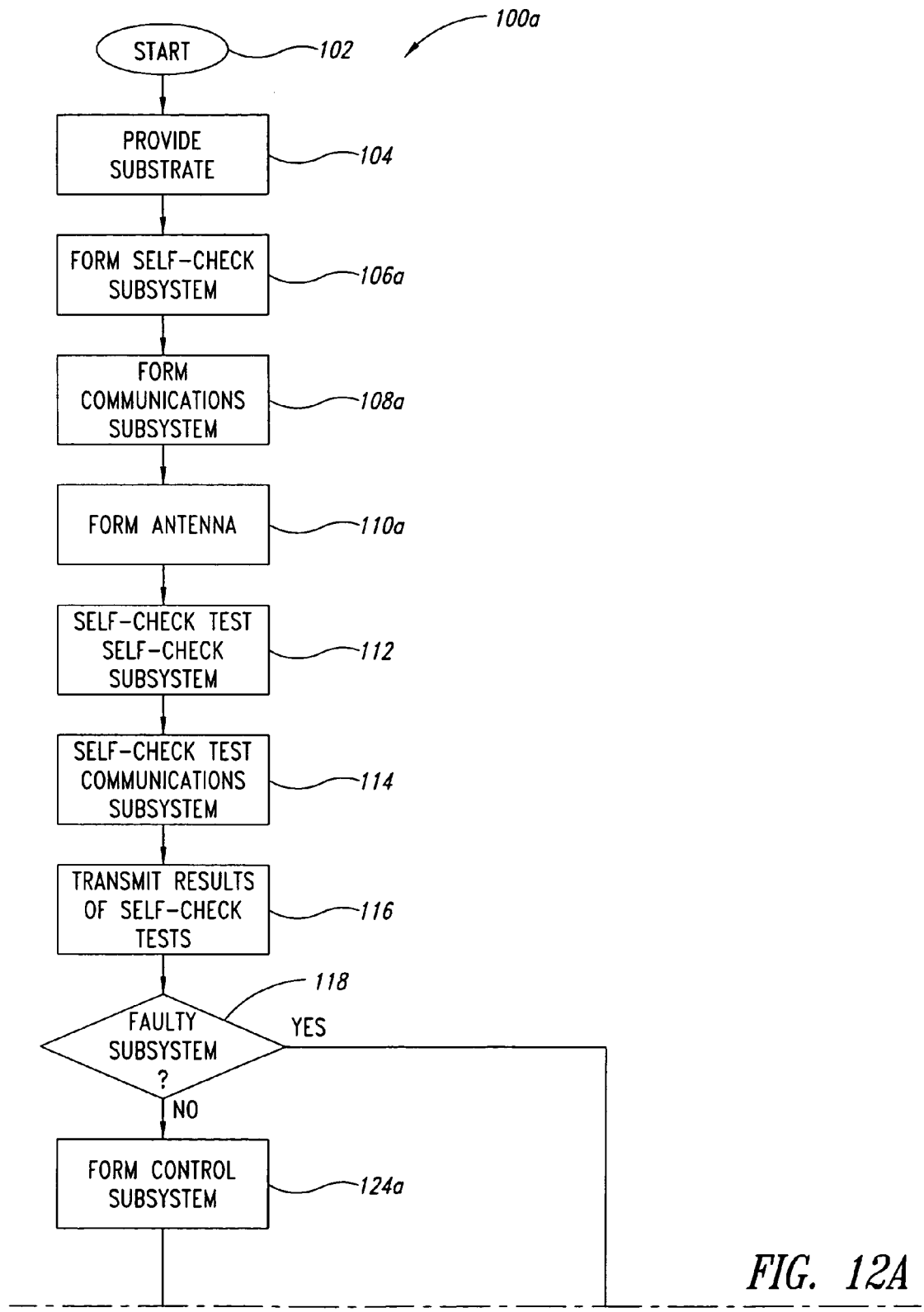
FIGS. 12A-12C are a flow diagram of a method of manufacturing a lab-on-chip system according to one illustrated embodiment.
Figure 12B:
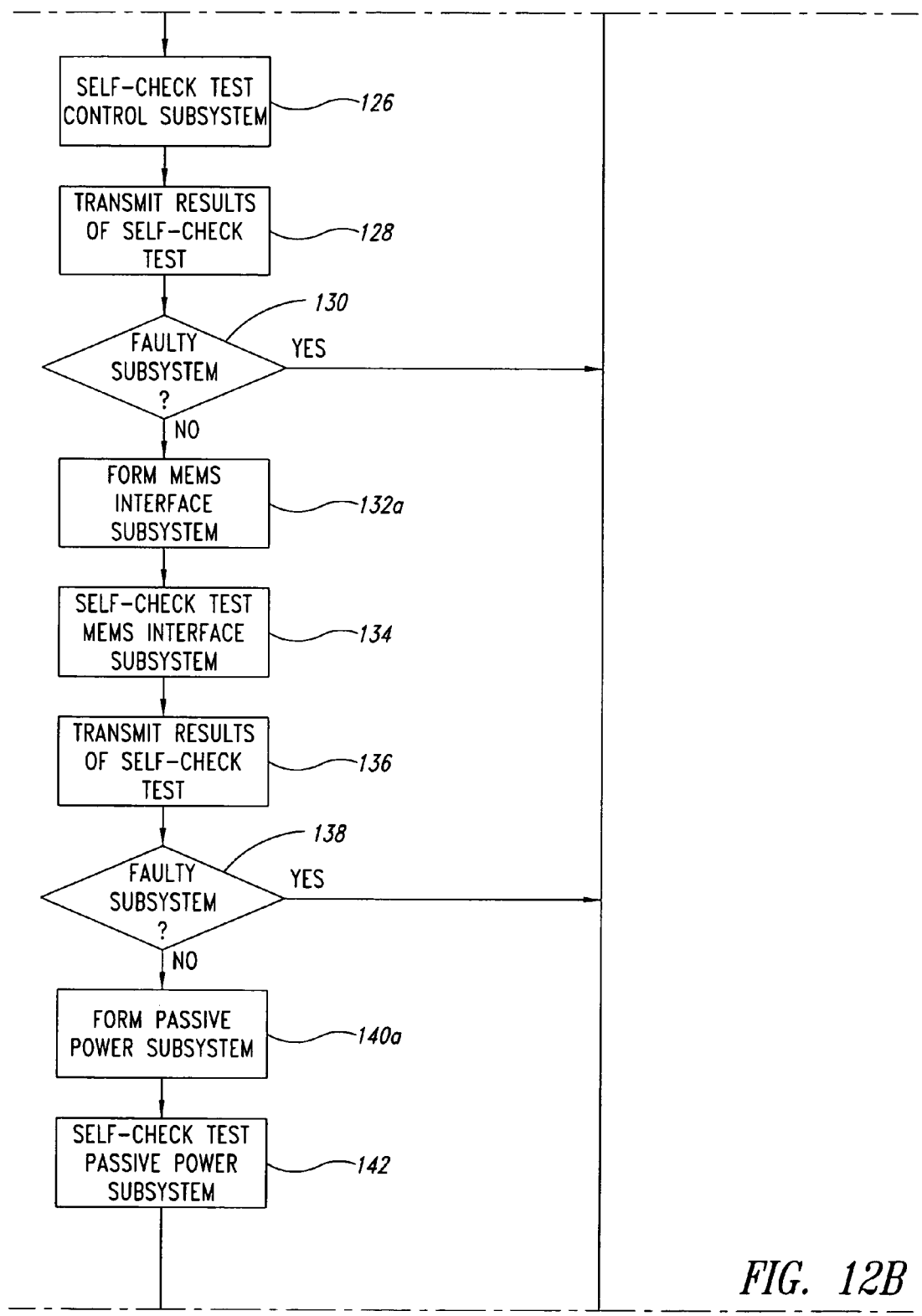
Figure 12C:
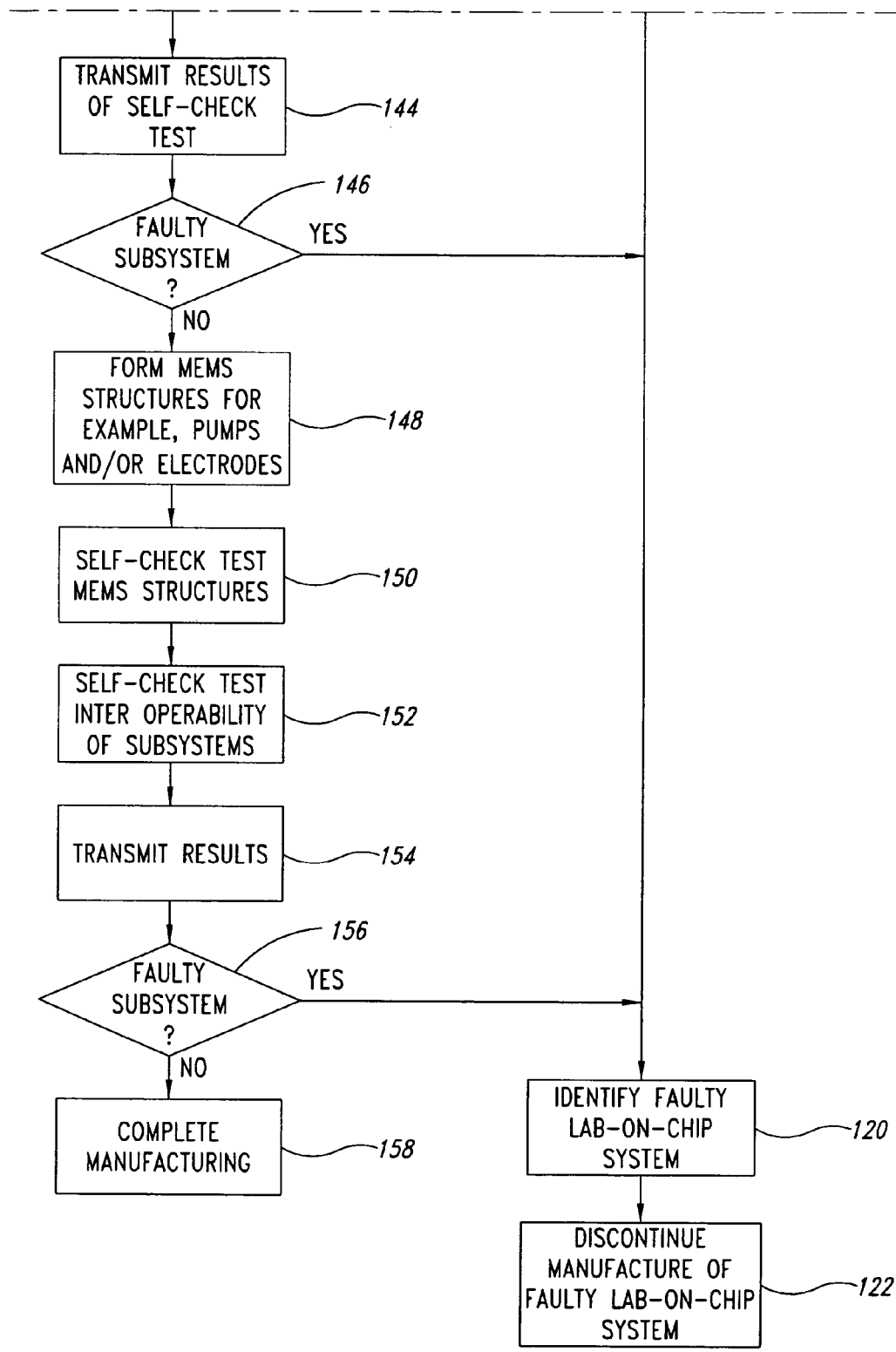

FIGS. 12A-12C show a method 100a of manufacturing a lab-on-chip system 10a according to one illustrated embodiment, starting at 102. The method 100a is discussed with reference to various elements of the lab-on-chip systems 10a illustrated in FIG. 1 and the manufacturing environment 70 illustrated in FIG. 10.

At 104, the substrate 12 is provided in the manufacturing environment 72 (FIG. 10). At 106a, the various manufacturing devices 72a-72c form the self check subsystem 22a on the substrate 12. At 108a, the various manufacturing devices 72a-72c form the communications subsystem 16a on the substrate 12. Optionally at 110a, the various manufacturing devices 72a-72c form the antenna 14a on the substrate 12. At 112, the self check subsystem 22a performs a self check test of itself. At 114, the self check subsystem 22a performs a self check test of the communications subsystem 16a. At 116, the communications subsystem 16a transmits results of the self check test via the antenna 14a.

At 118, the manufacturing computing system 74i determines if there is a faulty subsystem. If a faulty subsystem exists, at 120 the manufacturing computing system 74i identifies the faulty lab-on-chip system 10a, and at 122 discontinues manufacture of the faulty lab-on-chip system 10a. If a faulty subsystem does not exist, control passes to 124a.

At 124a, the manufacturing devices 72a-72c form the control subsystem 20a on the substrate 12. At 126, the self check subsystem 22a performs a self check of the control subsystem 20a. At 128, the communications subsystem 16a transmit the results of the self check test via the antenna 14a.

At 130, the manufacturing computing system 74i determines if a faulty subsystem exists. If a faulty subsystem exists, the manufacturing computing system 74i identifies the faulty lab-on-chip system 10a at 120 and discontinues manufacture of the faulty lab-on-chip system 10a at 122. If a faulty subsystem does not exist, control passes to 132a.

At 132a the manufacturing devices 72a-72c form a MEMS interface subsystem 24a on the substrate 12. At 134, the self check subsystem 22a performs a self check test of the MEMS interface subsystem 24a. At 136, the communications subsystem 16a transmits the results of the self check test via the antenna 14a.

At 138, the manufacturing computing system 74i determines if a faulty subsystem exists. If a faulty subsystem exists, the manufacturing computing system 74i identifies the faulty lab-on-chip system 10a at 120 and discontinues manufacture the faulty lab-on-chip system 10a at 122. If a faulty subsystem does not exist, control passes to 140a.

At 140a, the manufacturing devices 72a-72c form the passive power subsystem 18a on the substrate. 12. At 142, the self check subsystem 22a performs a self check test on the passive power system 18. At 144, the communications subsystem 16a transmits results of the self check test via antenna 14a, 14b.

At 146, the manufacturing computing system 74i determines if a faulty subsystem exists if a faulty subsystem exists, the manufacturing computing system 74i identifies the faulty lab-on-chip system 10a at 120 and discontinues manufacture of the faulty lab-on-chip system 10a at 122. If a faulty subsystem does not exist, control passes to 148.

At 148, the manufacturing devices 72a-72c form MEMS devices 26 on the substrate, for example one or more pumps, valves, gears, and/or electrodes. At 150, the self check subsystem 22a performs a self check test of the MEMS structures 26. At 152, the self check test subsystem 22a performs a self check test of the interoperability of subsystems 16a, 18a, 20a, 22a, 24a, 26. The self check test of interoperability of subsystems may be performed following each self check test of the individual subsystems. At 154, the communications subsystem 16a transmits results of the self check test via the antenna 14a.

At 156, the manufacturing computing system 74i determines if there is a faulty subsystem or lab-on-chip system 10a. If a subsystem is faulty or the interoperability of the subsystems s faulty the manufacturing computing device 74a identifies the faulty lab-on-chip system 10a at 120 and discontinues manufacture of the faulty lab-on-chip system 10a at 122. If the subsystems and interoperability of the subsystems are not faulty, manufacturing is completed at 158.

Figure 13A:
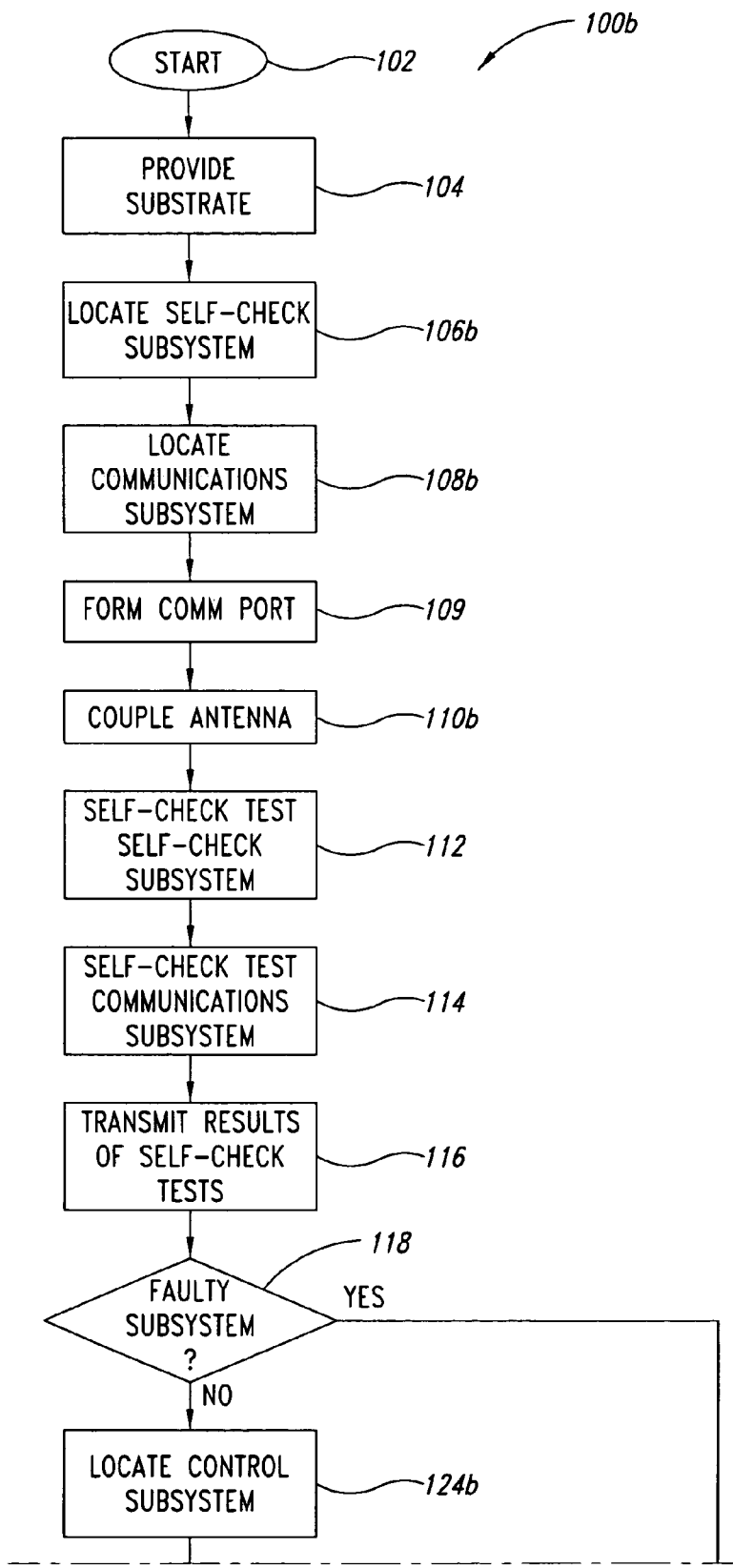
FIGS. 13A-13C are a flow diagram of a method of manufacturing a lab-on-chip system according to another illustrated embodiment.
Figure 13B:
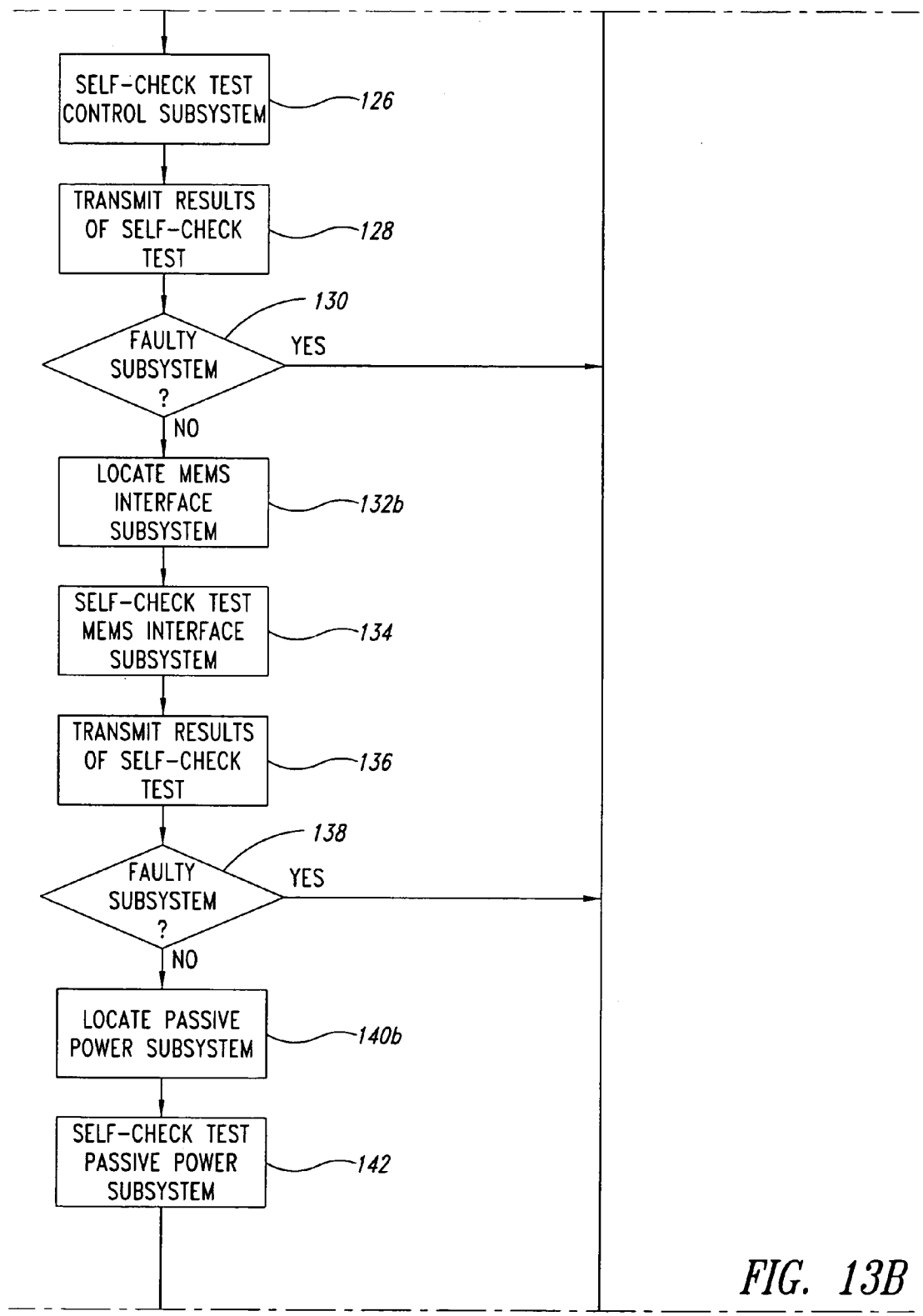
Figure 13C:
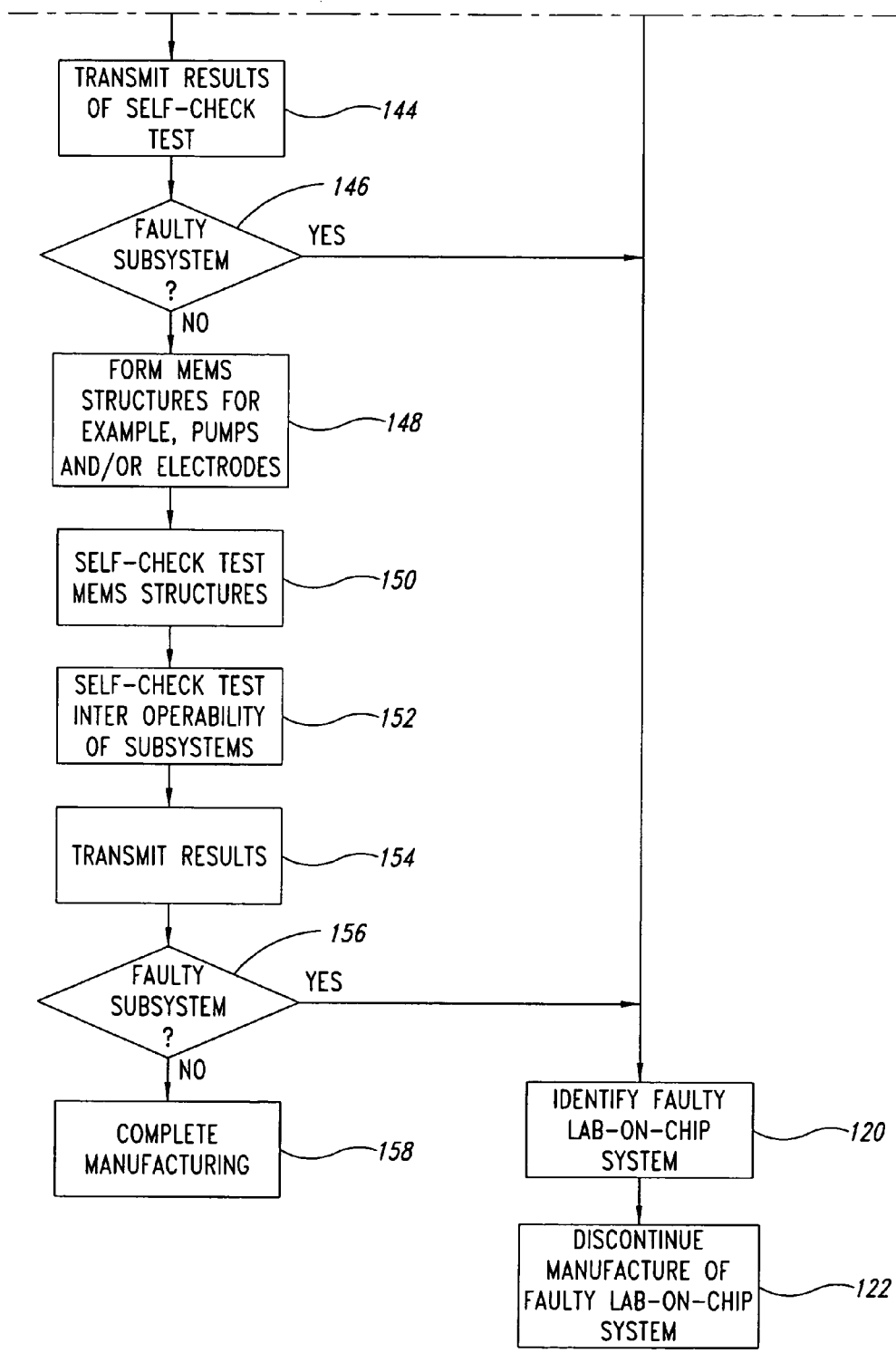

FIGS. 13A-13C show a method 100b of manufacturing a lab-on-chip system 10b according to one illustrated embodiment, starting at 102. The method 100b is discussed with reference to various elements of the lab-on-chip systems lob illustrated in FIGS. 3 and 4, as well as the manufacturing environment 70 illustrated in FIG. 10. Many of the acts in the method 100b are similar or identical to those of method 100a, thus common reference numerals are used to identify such. The method 100b assumes that each subsystem is provided independently. In some embodiments, some or all of the subsystems may be provided as a single integrated circuit, which may be packaged or unpackaged.

At 104, the substrate 12 is provided in the manufacturing environment 72 (FIG. 10). At 106b, manufacturing devices such as pick and place machinery 72d locate the self check subsystem 22b on the substrate 12. At 108b, manufacturing devices such as pick and place machinery 72d locate the communications subsystem 16b on the substrate 12.

At 109, a communications port 28 is formed in the substrate 12, for example, using the various manufacturing devices 72a-72d. At 110b, manufacturing devices such as pick and place machinery 72d couple the antenna 14b to the communications port 28. At 112, the self check subsystem 22b performs a self check test of itself. At 114, the self check subsystem 22b performs a self check test of the communications subsystem 16b. At 116, the communications subsystem 16b transmits results of the self check test via the antenna 14b.

At 118, the manufacturing computing system 74i determines if there is a faulty subsystem. If a faulty subsystem exists, at 120 the manufacturing computing system 74i identifies the faulty lab-on-chip system 10b, and at 122 discontinues manufacture of the faulty lab-on-chip system 10b. If a faulty subsystem does not exist, control passes to 124b.

At 124b, manufacturing devices such as pick and place machinery 72d locate the control subsystem 20b on the substrate 12. At 126, the self check subsystem 22b performs a self check of the control subsystem 20b. At 128, the communications subsystem 16b transmit the results of the self check test via the antenna 14b.

At 130, the manufacturing computing system 74i determines if a faulty subsystem exists. If a faulty subsystem exists, the manufacturing computing system 74i identifies the faulty lab-on-chip system 10b at 120 and discontinues manufacture of the faulty lab-on-chip system 10b at 122. If a faulty subsystem does not exist, control passes to 132b.

At 132b, manufacturing devices such as pick and place machinery 72d locate a MEMS interface subsystem 24b on the substrate 12. At 134, the self check subsystem 22b performs a self check test of the MEMS interface subsystem 24b. At 136, the communications subsystem 16b transmits the results of the self check test via the antenna 14b.

At 138, the manufacturing computing system 74i determines if a faulty subsystem exists. If a faulty subsystem exists, the manufacturing computing system 74i identifies the faulty lab-on-chip system 10b at 120 and discontinues manufacture of the faulty lab-on-chip system 10b at 122. If a faulty subsystem does not exist, control passes to 140b.

At 140b, manufacturing devices such as pick and place machinery 72d locate the passive power subsystem 18b on the substrate 12. At 142, the self check subsystem 22b performs a self check test on the passive power system 18b. At 144, the communications subsystem 16b transmits results of the self check test via antenna 14b.

At 146, the manufacturing computing system 74i determines if a faulty subsystem exists. If a faulty subsystem exists, the manufacturing computing system 74i identifies the faulty lab-on-chip system 10b at 120 and discontinues manufacture of the faulty lab-on-chip system 10b at 122. If a faulty subsystem does not exist, control passes to 148.

At 148, the manufacturing devices 72a-72c form MEMS devices 26 on the substrate 12, for example one or more pumps, valves, gears, and/or electrodes. At 150, the self check subsystem 22b performs a self check test of the MEMS structures 26. At 152, the self check test subsystem 22b performs a self check test of the interoperability of subsystems 16b, 18b, 20b, 22b, 24b, 26b. The self check test of interoperability of subsystems may be performed following each self check test of the individual subsystems. At 154, the communications subsystem 16b transmits results of the self check test via the antenna 14b.

At 156, the manufacturing computing system 74i determines if there is a faulty subsystem or lab-on-chip system 10b. If a subsystem is faulty or the interoperability of the subsystems is faulty the manufacturing computing device 74a identifies the faulty lab-on-chip system 10b at 120 and discontinues manufacture of the faulty lab-on-chip system 10b at 122. If the subsystems and lab-on-chip system 10b are not faulty, manufacturing is completed at 158.

Figure 14:
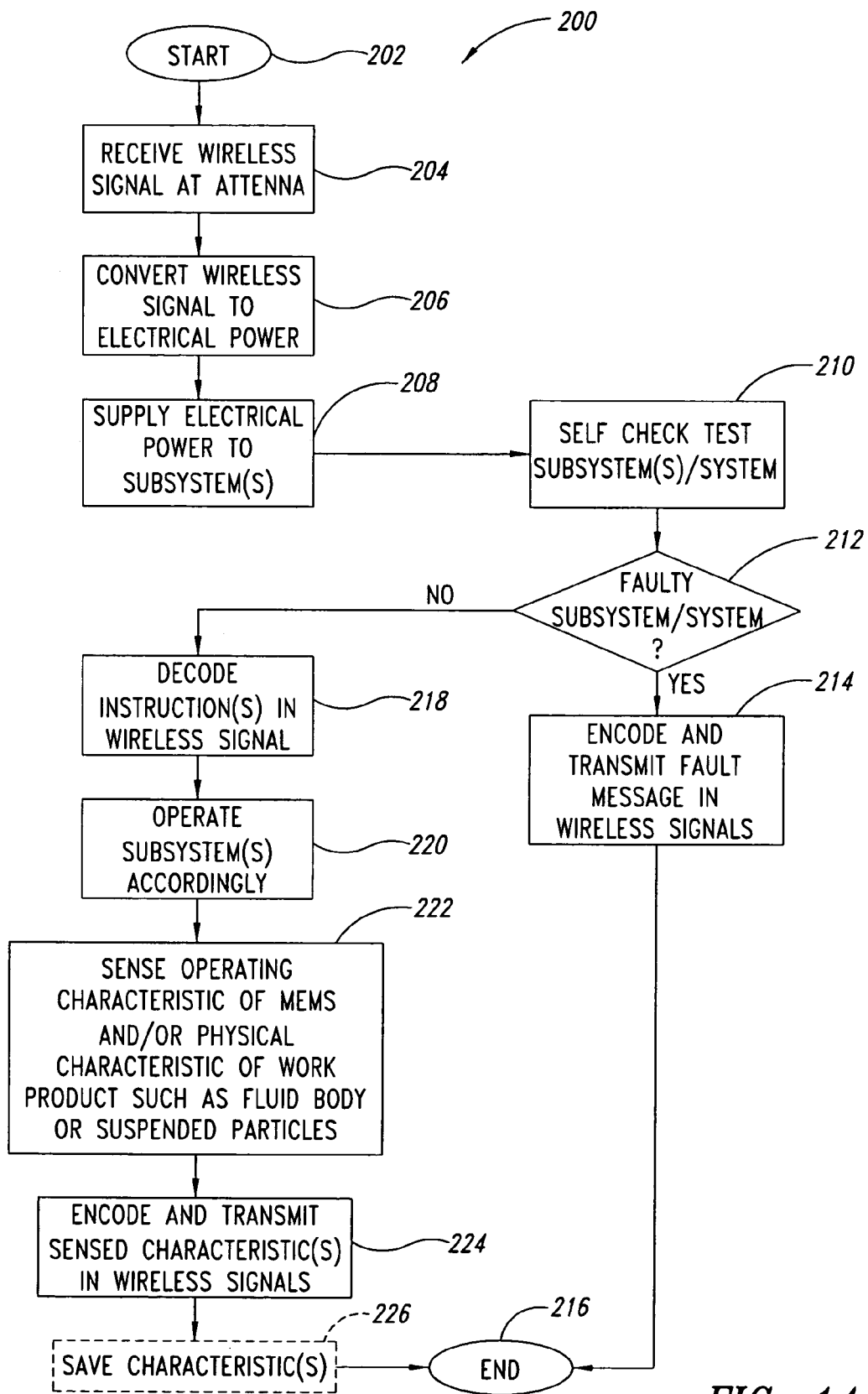
FIG. 14 is a flow diagram illustrating a method of operating a lab-on-chip system according to one illustrated embodiment.

FIG. 14 shows a method 200 of operating a lab-on-chip system 10 according to one illustrated embodiment, starting at 202. The method 200 is discussed with reference to various elements of the lab-on-chip systems 10 illustrated in FIGS. 1, 3 and the laboratory environment 76 illustrated in FIG. 11.

At 204, an electromagnetic field is received at the antenna 14 of the lab-on-chip system 10. The electromagnetic field may, for example, take the form of a wireless signal. At 206, the passive power subsystem 18a, if any, converts the electromagnetic field to electric power. At 208, the passive power subsystem 18a supplies electrical power to one or more of the other subsystems 16a, 20a, 22a, 24a, 26. Alternatively, the discrete power source 18b may supplied power to one or more of the other subsystems 16a, 20a, 22a, 24a, 26.

At 210, the self check subsystem 22 may optionally perform a self check of one or more of the subsystems and/or interoperability of the subsystems. At 212, the self check subsystem 22 and/or the control subsystem 20 determines if there is a faulty subsystem or if the lab-on-chip system 10 is faulty. If a fault is detected, at 214 the communications subsystem 16 encodes and transmits a fault message via the antenna 14 and the method terminates at 216.

If the subsystems and lab-on-chip system 10 are not faulty, the control system 20 decodes instructions, if any, contained in the wireless signal. At 220, the control subsystem 20 controls operation of the various subsystems according to instructions previously provided or received via the wireless signal.

At 222, one or more sensors sense operating characteristics of the MEMS and/or physical characteristics of the work product such as fluid body 34 or particles 46 suspended in the fluid body 34. At 224, the communications subsystem 16a encodes and transmits the sensed characteristics to the laboratory computing system 78c via the antenna 14, antenna 78a, and transceiver 78b. Optionally at 226, the control subsystem 20a saves the sensed characteristics to memory.

As discussed above, certain embodiments may provide distinct advantages over conventional lab-on-chip systems. For example, self check testing allows faults to be discovered during manufacturing or during use. By combining the self checking test with a modular approach to manufacturing, defects may be detected and manufacturing operations ceased or revised to eliminate useless manufacturing operations, thereby reducing costs and/or increasing manufacturing throughput. For example, fatal defects in an earlier manufactured subsystem may be caught before subsequent subsystems are manufactured. The lab-on-chip system 10 with the faulty subsystem may be marked or otherwise identified and further manufacturing operations on the particular lab-on-chip system avoided. Alternatively, a substitute subsystem for the faulty subsystem may be manufactured or activated (e.g., coupled into with the other subsystems, for example, during the manufacture of those other subsystems). Discovering faults before or during operation may allow experiments to not be started or ceased before significant amounts of time have pasted, particular where the lab-on-chip system is unlikely to produce reliable results. Other lab-on-chip systems may be timely substituted for the faulty lab-on-chip system.

Also for example, use of wireless transmission may eliminate the need for complicated and costly physical connections. The use of a passive power subsystem may extend the useful life of the lab-on-chip system, since such will not depend on the life of a battery. The use of wireless transmission may also allow control over the operation of the lab-on-chip system, include reprogramming. Further, the use of wireless communications significantly enhances the ability toe perform self check testing in the manufacturing environment, where physical connections would be difficult, if even possible.

The above description of illustrated embodiments, including what is described in the Abstract, is not intended to be exhaustive or to limit the invention to the precise forms disclosed. Although specific embodiments of and examples are described herein for illustrative purposes, various equivalent modifications can be made without departing from the spirit and scope of the invention, as will be recognized by those skilled in the relevant art. The teachings provided herein of the invention can be applied to other MEMS devices, not necessarily the exemplary MEMS devices generally described above. The lab-on-chip system may include fewer or additional subsystems, and elements from one embodiment may be used with other embodiments. For example, some of the subsystems of a lab-on-chip system 10 may be integrally formed with each other, while other ones of the subsystems are provided as discrete packages. For example, the control, self check and MEMS interface subsystems 20, 22, 24 may be formed as a an integrated circuit on the substrate 12, while the communications subsystem 16 and/or passive power subsystem 18a may be formed as one or more discrete components and located on the substrate.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that some of the mechanisms taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communications links using TDM or IP based communications links (e.g., packet links).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. provisional patent application Ser. No. 60/492,123, filed Aug. 1, 2003; U.S. provisional patent application Ser. No. 60/492,125, filed Aug. 1, 2003; U.S. Pat. No. 6,429,775; U.S. Pat. No. 5,808,587; U.S. Pat. No. 5,973,598; U.S. Pat. No. 6,294,997; and/or U.S. application Ser. No. 10/909,919 filed currently with this application and entitled INTEGRATED TEST-ON-CHIP SYSTEM AND METHOD AND APPARATUS FOR MANUFACTURING AND OPERATING SAME, are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all lab-on-chip systems; methods of manufacturing and/or operating lab-on-chip systems and/or devices or systems for manufacturing and/or operating lab-on-chip systems that operated in accordance with the claims. Accordingly, the invention is not limited by the disclosure, but instead its scope is to be determined entirely by the following claims.

We claim:

1. A lab-on-chip system, comprising:
   a substrate;
   at least a first micro-electrical-mechanical structure formed on at least a portion of the substrate, the first micro-electrical-mechanical structure operable to perform at least one physical action on at least one physical work product;
   an antenna carried by the substrate;
   a passive power circuit carried by the substrate and coupled to the antenna to wirelessly receive power thereby in the form of an electromagnetic field and coupled to provide power to operate at least the first micro-electrical-mechanical structure;
   a controller carried by the substrate and communicatively coupled to control operation of at least the first micro-electrical-mechanical structure by executing a set of instructions; and
   a communications circuit carried by the substrate and operable to wirelessly transmit data from and to the lab-on-chip system,
   wherein the instructions are receivable via the antenna and the communication circuit.

2. The lab-on-chip system of claim 1, further comprising:
   at least a first sensor carried by the substrate and operable to sense at least one operating characteristic of the first micro-electrical-mechanical structure;
   a communications circuit carried by the substrate and operable to wirelessly transmit information regarding the at least one operating characteristic of the first micro-electrical-mechanical structure from the lab-on-chip system.

3. The lab-on-chip system of claim 1, further comprising:
   at least a first sensor carried by the substrate and operable to sense at least one physical characteristic of the physical work product;
   a communications circuit carried by the substrate and operable to wirelessly transmit information regarding the at least one physical characteristic of the physical work product from the lab-on-chip system.

4. The lab-on-chip system of claim 1 wherein the first micro-electrical-mechanical structure comprises at least a first micro-fluidic structure formed on at least a portion of the substrate, the first micro-fluidic structure operable to move at least a first fluid component.

5. The lab-on-chip system of claim 4 wherein the first fluid component is a body of fluid.

6. The lab-on-chip system of claim 4 wherein the first fluid component is a number of particles suspended in a fluid medium.

7. The lab-on-chip system of claim 1 wherein the at least a first micro-electrical-mechanical structure comprises an array of electrodes operable to move at least a first fluid component.

8. The method of claim 1, further comprising a self check subsystem.

9. A lab-on-chip system, comprising:
   a substrate;
   at least a first micro-electrical-mechanical structure formed on at least a portion of the substrate, the first micro-electrical-mechanical structure operable to perform at least one physical action on at least one physical work product;
   an antenna carried by the substrate;
   a controller carried by the substrate and communicatively coupled to control operation of at least the first micro-electrical-mechanical structure by executing a set of instructions; and
   a communications circuit carried by the substrate, the communications circuit coupled to the antenna and operable to wirelessly transmit information from and to the lab-on-chip system, wherein the instructions are receivable via the antenna and the communication circuit.

10. The lab-on-chip system of claim 9, further comprising:
    at least a first sensor carried by the substrate and operable to sense at least one operating characteristic of the first micro-electrical-mechanical structure, wherein the communications circuit is operable to wirelessly transmit information regarding the at least one operating characteristic of the first micro-electrical-mechanical structure from the lab-on-chip system.

11. The lab-on-chip system of claim 9, further comprising:
    at least a first sensor carried by the substrate and operable to sense at least one physical characteristic of the physical work product, wherein the communications circuit is operable to wirelessly transmit information regarding the at least one physical characteristic of the physical work product from the lab-on-chip system.

12. The lab-on-chip system of claim 9, further comprising:
    a passive power circuit carried by the substrate and coupled to the antenna to wirelessly receive power thereby in the form of an electromagnetic filed and coupled to provide power to operate at least the first micro-electrical-mechanical structure.

13. The lab-on-chip system of claim 9, further comprising:
    a controller carried by the substrate and communicatingly coupled to control operation of at least the first micro-electrical-mechanical structure.

14. The lab-on-chip system of claim 9, further comprising:
    a controller carried by the substrate and communicatingly coupled to control operation of at least the first micro-electrical-mechanical structure; and
    a passive power circuit carried by the substrate and coupled to the antenna to wirelessly receive power thereby in the form of an electromagnetic field and coupled to provide power to operate the controller and at least the first micro-electrical-mechanical structure.

15. The lab-on-chip system of claim 9 wherein the antenna is carried by the substrate.

16. The lab-on-chip system of claim 9, further comprising:
    a communications port, wherein the antenna is communicatively coupled to the communications port and the antenna is not carried by the substrate.

17. The lab-on-chip system of claim 9, further comprising:
    a power storage device carried by the substrate and coupled to provide power to operate at least the first micro-electrical-mechanical structure.

18. The lab-on-chip system of claim 17 wherein the power storage device comprises at least one of a battery and an ultra-capacitor.

19. The lab-on-chip system of claim 9, further comprising a self check subsystem.

20. A method of operating a lab-on-chip system, the method comprising:
    wirelessly receiving an electromagnetic field at an antenna on a substrate;
    converting the wireless signal into electrical power;
    receiving instructions via the antenna and a communication circuit for a controller; and
    driving at least one micro-electrical-mechanical structure with the electrical power, wherein the at least one micro-electrical-mechanical structure is formed on the substrate.

21. The method of claim 20 wherein wirelessly receiving an electromagnetic field at an antenna comprises receiving an radio frequency signal at the antenna.

22. The method of claim 20, further comprising:
supplying a portion of the electrical power to a controller coupled to control operation of the at least one micro-electrical-mechanical structure.

23. The method of claim 20, further comprising:
sensing at least one operating characteristic of the first micro-electrical-mechanical structure; and
wirelessly transmitting information regarding the at least one operating characteristic of the micro-electrical-mechanical structure from the lab-on-chip system.

24. The method of claim 20, further comprising:
sensing at least one operating characteristic of the first micro-electrical-mechanical structure; and
storing information regarding the at least one operating characteristic of the first micro-electrical-mechanical structure on the lab-on-chip system.

25. The method of claim 20, further comprising:
sensing at least one physical characteristic of a physical work product operated on by the first micro-electrical-mechanical structure; and
wirelessly transmitting information regarding the at least one physical characteristic of the physical work product from the lab-on-chip system.

26. The method of claim 20, further comprising:
sensing at least one physical characteristic of the fluid operated on by the first micro-electrical-mechanical structure; and
wirelessly transmitting information regarding the at least one physical characteristic of the fluid from the lab-on-chip system.

27. The method of claim 20 wherein the at least one micro-electrical-mechanical structure is a pump and driving at least one micro-electrical-mechanical structure with the electrical power comprises driving the pump to move a fluid.

28. A method of operating a lab-on-chip system; the method comprising:
performing with a first micro-electrical-mechanical structure formed on a substrate at least one physical action on a work product;
determining a physical characteristic of the physical work product; and
wirelessly transmitting with an antenna carried on the substrate the determined information from the lab-on-chip system.

29. The method of claim 28, further comprising:
sensing the operating characteristic of the first micro-electrical-mechanical structure.

30. The method of claim 28, further comprising:
wirelessly receiving information at the lab-on-chip system;
controlling operating of the first micro-electrical-mechanical structure based on the received information.

31. The method of claim 28, further comprising:
passively deriving energy to operate the first micro-electrical-mechanical structure from a wireless transmission received at the antenna of the lab-on-chip system.

32. The method of claim 28, further comprising:
sensing the physical characteristic of the physical work product.

33. A method of operating a lab-on-chip system, the method comprising:
wirelessly receiving an electromagnetic field at an antenna;
converting the wireless signal into electrical power; and
using the electrical power to selectively apply respective electrical potentials to each of a plurality of electrodes to move a fluid component in a controlled manner.

34. The method of claim 33 wherein wirelessly receiving an electromagnetic field at an antenna comprises receiving an radio frequency signal at the antenna.

35. The method of claim 33, further comprising:
supplying a portion of the electrical power to a controller coupled to control operation of the plurality of electrodes.

36. The method of claim 33, further comprising:
sensing at least one operating characteristic of at least one of the plurality of electrodes; and
wirelessly transmitting information regarding the at least one operating characteristic from the lab-on-chip system.

37. The method of claim 33, further comprising:
sensing at least one operating characteristic of at least one of the plurality of electrodes; and
storing information regarding the at least one operating characteristic on the lab-on-chip system.

38. The method of claim 33, further comprising:
sensing at least one physical characteristic of the fluid component operated on by the plurality of electrodes; and
wirelessly transmitting information regarding the at least one physical characteristic from the lab-on-chip system.

39. The method of claim 33 wherein the fluid component is a microfluidic body, further comprising:
sensing at least one physical characteristic of the microfluidic body operated on by the plurality of electrodes; and
wirelessly transmitting information regarding the at least one physical characteristic of the microfluidic body from the lab-on-chip system.

40. The method of claim 33 wherein using the electrical power to selectively apply respective electrical potentials to each of a plurality of electrodes to move a fluid component in a controlled manner includes sequentially applying respective electrical potentials to each of at least two of the plurality of electrodes.

41. A method of operating a lab-on-chip system the method comprising:
determining at least one of an operating characteristic of a first micro-electrical-mechanical structure formed on a substrate or a physical characteristic of the physical work product; and
storing the determined information in a memory carried by the substrate.

42. The method of claim 41, further comprising:
sensing the operating characteristic of the first micro-electrical-mechanical structure.

43. The method of claim 41, further comprising:
sensing the physical characteristic of the physical work product.

44. The method of claim 41, further comprising:
passively deriving energy to operate the first micro-electrical-mechanical structure from an electromagnetic field received at an antenna of the lab-on-chip system.

* * * * *